United States Patent
Chuang et al.

(10) Patent No.: US 6,884,689 B2
(45) Date of Patent: Apr. 26, 2005

(54) FABRICATION OF SELF-ALIGNED BIPOLAR TRANSISTOR

(75) Inventors: Shu-Ya Chuang, Hsinchu Hsien (TW); Jing-Horng Gau, Hsinchu Hsien (TW); Anchor Chen, Pingtung (TW)

(73) Assignee: United Microelectronics Corp., Hsinchu (TW)

( * ) Notice: Subject to any disclaimer, the term of this patent is extended or adjusted under 35 U.S.C. 154(b) by 170 days.

(21) Appl. No.: 10/290,635

(22) Filed: Nov. 12, 2002

(65) Prior Publication Data

US 2003/0096486 A1 May 22, 2003

Related U.S. Application Data

(63) Continuation-in-part of application No. 09/956,503, filed on Sep. 19, 2001, now abandoned.

(30) Foreign Application Priority Data

Sep. 4, 2001 (TW) .......................... 90121827 A (51) Int. Cl.⁷ ............................................. H01L 21/331
(52) U.S. Cl. ..................................................... 438/369
(58) Field of Search ................................. 438/377, 376, 438/375, 374, 373, 372, 371, 370, 369, 309

(56) References Cited

U.S. PATENT DOCUMENTS

2003/0012925 A1 * 1/2003 Gorrell ........................ 428/137

* cited by examiner

*Primary Examiner*—Evan Pert
*Assistant Examiner*—Monica D. Harrison
(74) *Attorney, Agent, or Firm*—Chyun IP Office (57) ABSTRACT

A method for fabricating a self-aligned bipolar transistor, wherein a substrate having an epitaxial layer formed thereon as a base is provided. After this, a first dielectric layer, a second dielectric layer are sequentially formed on the epitaxial layer, followed by forming an opening in the second dielectric layer. A conductive spacer is formed on the sidewall of the opening. Using the second dielectric layer and the conductive spacer as a mask, a first dielectric layer in the opening is removed. A conductive layer is then formed in the opening as an emitter, followed by completely removing the second dielectric layer. A doping is conducted on the emitter. Using the emitter and the conductive spacer as a mask, a part of the first dielectric layer is removed. Further using the emitter and the conductive spacer as a mask, another doping is conducted to form a part of the epitaxial layer as a base contact region.

30 Claims, 11 Drawing Sheets

FABRICATION OF SELF-ALIGNED BIPOLAR TRANSISTOR

CROSS-REFERENCE TO RELATED APPLICATION

This application is a continuation-in-part of prior application Ser. No. 09/956,503, filed Sep. 19, 2001 now abandoned.

BACKGROUND OF THE INVENTION

1. Field of the Invention

The present invention relates to a method of fabricating a bipolar junction transistor (BJT), and in particular, a method of fabricating a self-aligned bipolar transistor.

2. Description of the Related Art

A bipolar transistor is an electronic device which simultaneously utilizes two carriers, i.e. electrons and holes, to conduct current. The structure of a bipolar transistor is a three terminal device formed from two closely connected pn junctions. The three terminals include an emitter, a base and a collector. However, in a common bipolar transistor, the emitter and the base are connected to a same material. An improvement with respect to current gain and emitter effectiveness is limited. In order to overcome the above drawbacks, a heterojunction bipolar transistor is utilized.

HBT refers to a bipolar transistor formed from a heterojunction. The so-called "heterojunction" refers to the utilization of a wider bandgap material for the emitter than that for the base. Further, in switch applications, HBT has the advantage of high current gain and extremely high cut-off frequency, and in microwave applications, HBT has the advantage of high power gain and high power density.

A typical manufacturing method for a bipolar junction transistor is described with reference to FIGS. 1A to 1E. FIGS. 1A through 1E are schematic, cross-sectional views showing a heterojunction bipolar transistor formed according to a conventional fabrication process.

Figure 1A:
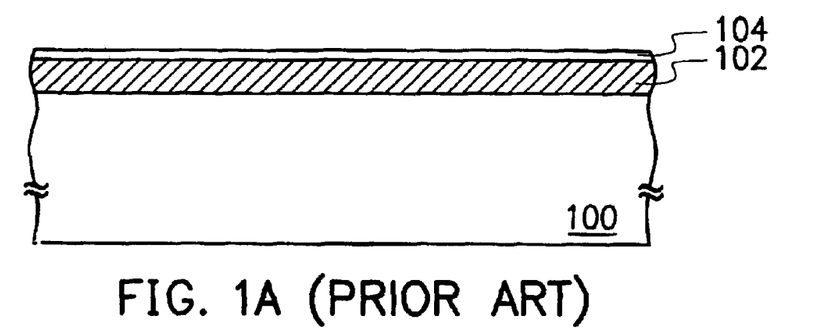
FIGS. 1A to 1E are cross-sectional views showing a fabrication process for heterojunction bipolar transistor according to the prior art.

As shown in FIG. 1A, a non-selective silicon-germanium (SiGe) epitaxial layer 102 is deposited over a substrate 100 that already comprises a collector terminal thereon. An insulation layer 104 is then deposited over the SiGe epitaxial layer 102.

Figure 1B:
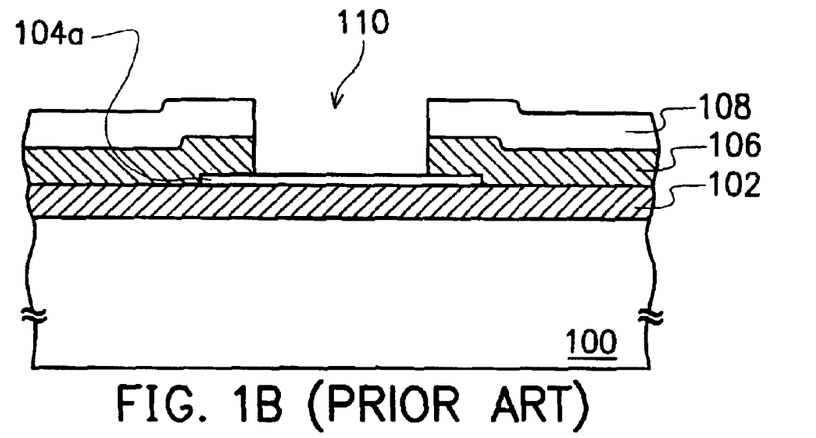

In FIG. 1B, a part of the insulation layer 104 is removed by a photolithography and etching process to form an insulation layer 104a, and then, a polysilicon conductive layer 106 and an insulation layer 108 are sequentially formed on the substrate 100. Thereafter, a part of the insulation layer 108 and the polysilicon conductive layer 106 are removed by photolithography and etching process to expose an opening 110 of the insulation layer 104a.

Figure 1C:
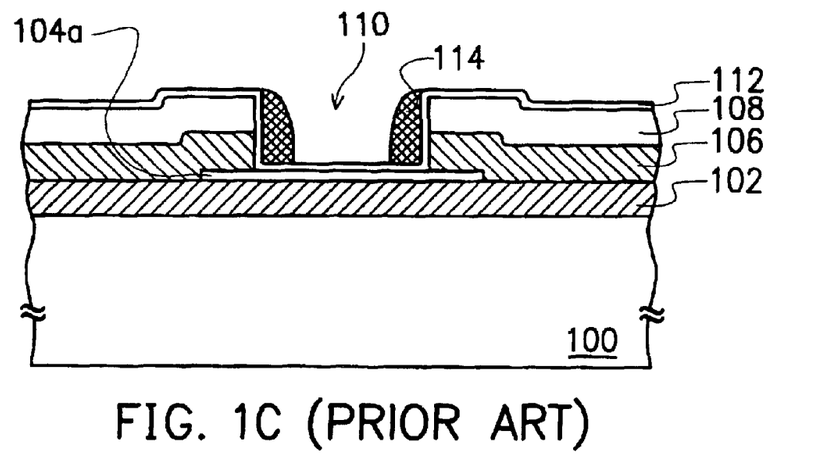

In FIG. 1C, a conformal insulation layer 112 is deposited over the substrate 100, and a spacer 114 is formed on the two sidewalls of the opening 110.

Figure 1D:
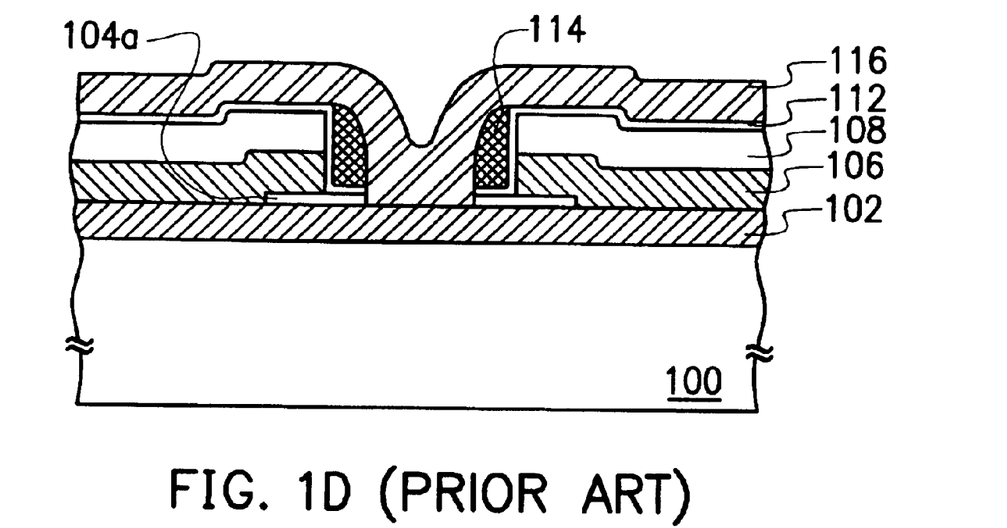

In FIG. 1D, the spacer 114 is utilized as a mask, and the insulation layer 112 within the opening 110 is removed by etching to expose the SiGe epitaxial layer 102. After that, a polysilicon conductive layer 116 is deposited over the substrate 100.

Figure 1E:
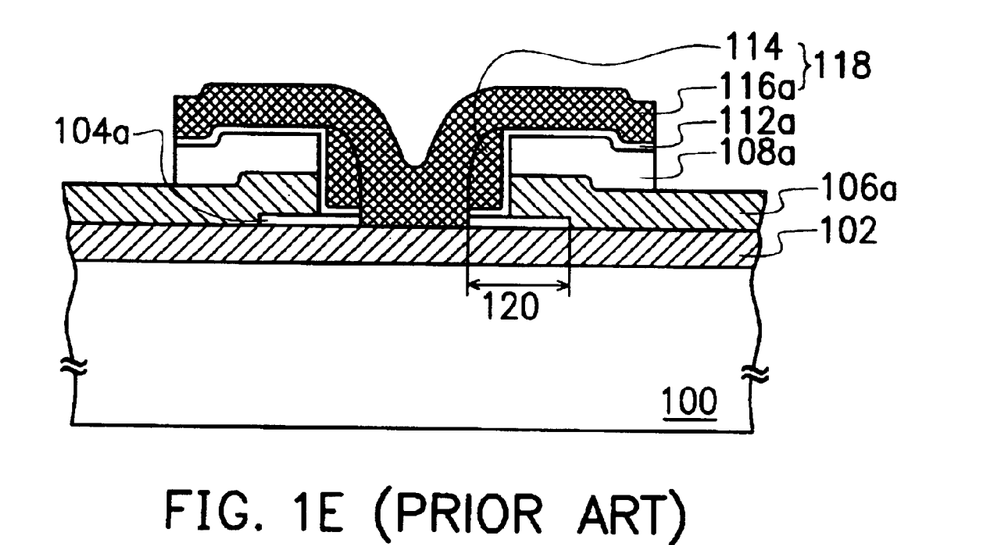

In FIG. 1E, a photolithography and etching method is used to define the polysilicon conductive layer 116, the insulation layer 112 and the insulation layer 108 to form the polysilicon conductive layer 116a, the insulation layer 112a and the insulation layer 108a. The polysilicon conductive layer 116a and the spacer 114 together form the emitter 116a of HBT and the polysilicon layer 106a form the base of HBT.

In the above fabrication process, several photolithography and etching process steps are required to form the emitter and the base for the HBT device, which would increase the cost of the device. Another problem is that the control limit of the lithography process would impact the device performance. For example, the window size of the emitter and the base would affect the current gain. Further, improper etching process would induce damages on the SiGe surface. Thus, a self-aligned HBT process is being developed to improve the aforementioned problems.

One prior art which deals with reducing the number of photolithography processes is described in U.S. Pat. No. 5,656,514 issued to Ahlgren et al. Ahlgren et al. use a self-aligned emitter implantation through an emitter opening window and rapid thermal annealing to obtain a high performance HBT. However, the process in forming the emitter opening window in the base opening is not a self-aligned process, and the positioning may or may not be critical. Further, an extrinsic base implant is not suitable for this method.

The U.S. Pat. No. 5,106,767 issued to Comfort et al. provides another process of fabricating a self-aligned heterojunction biopolar transistor using a non-selective epitaxy base and multi-dielectric layer to form a HBT structure. However, the process is complicated and might cause improper diffusion of the base impurity during oxidation.

In another prior art approach shown in U.S. Pat. No. 6,417,059B2 by Huang, Huang describes a process using an etch stop layer on the base area to protect the SiGe layer from being damaged during the etch process. However, this process is not a self-aligned process and the junction positioning is critical. Further, the etch stop layer on the extrinsic base layer would restrict the base electrode silicidation capability and cause a higher resistivity.

SUMMARY OF THE INVENTION

Accordingly, the present invention provides a method for fabricating a self-aligned bipolar transistor and a structure thereof, wherein a self-aligned method is utilized to form the emitter and the base to provide wider process windows.

The present invention further provides a method for fabricating a self-aligned bipolar transistor, wherein the number of photolithographic process steps is reduced so as to simplify the fabrication process and to lower the cost of the fabrication process.

In order to achieve the above and other objects, the present invention provides a method of fabricating a self-aligned bipolar transistor. The method provides a substrate that comprises a collector. An epitaxial layer is formed over the substrate as a base. A first dielectric layer, a second dielectric layer are sequentially formed on the epitaxial layer, followed by forming an opening in the second dielectric layer. A conductive spacer is then formed on the sidewall of the opening. Using the second dielectric layer and the conductive spacer as a mask, the first dielectric layer in the opening is removed. After this, a conductive layer is formed on the first dielectric layer filling the opening. The emitter is then formed by removing the conductive layer outside the opening. A first doping process is optionally performed on the emitter to further reduce the resistivity of the emitter. Using the emitter and the conductive spacer as a mask, a portion of the first dielectric layer is removed. A second doping process with a different dopant type from that of the first doping process is performed on the epitaxial layer to form an extrinsic base contact region. A spacer is further formed on the on the sidewalls of the emitter and the remaining of the first dielectric layer. A silicide layer is further formed on the emitter, the conductive spacer and the extrinsic base contact region.

The present invention provides a structure of a self-aligned bipolar transistor. The structure includes at least a substrate that serves as a collector, a base, an extrinsic base contact region, an emitter and a conductive spacer. The base is disposed on the substrate, and the extrinsic base contact region is positioned on the substrate beside both sides of the base. The emitter is disposed on the base and the conductor spacer is disposed over the top part of the sidewall of the emitter.

In order to well control the process, the present invention provides another fabrication method for a self-aligned bipolar transistor. This method provides a substrate served as a collector. An epitaxial layer serving as the base is already formed on the substrate. A first dielectric layer, a second dielectric layer, a third dielectric layer and a fourth dielectric layer are sequentially formed on the epitaxial layer while the first and the second dielectric layers act as etch stop layer. An opening is formed in the fourth dielectric layer and a conductive spacer is also formed on the sidewall of the opening. In order to protect the epitaxial base layer from being destroyed during the etching process, the second layer and the third dielectric layer, the fourth dielectric layer and the conductive spacer are used as a mask while the first dielectric layer, the second dielectric layer and the third dielectric layer in the opening are removed. The third dielectric layer is plasma etched and stopped on the second dielectric layer. The second dielectric layer is then plasma etched and stopped on the first dielectric layer. The first dielectric layer is then being wet etched to expose the base epitaxial layer without damaging the base surface. A conformal first conductive layer is then formed on the fourth dielectric layer, filling the opening, followed by performing a first doping process on the first conductive layer. A second conductive layer is then formed on the first conductive layer, filling the opening. A portion of the first conductive layer and the second conductive layer that are outside the opening is removed to form the emitter. The fourth conductive layer is then completely removed, followed by performing a second doping process on the emitter to reduce the resistivity of the emitter. Using the emitter and the conductive spacer as a mask, the third, the second and the first dielectric layers are removed and a third doping process is conducted on the extrinsic part of the epitaxial base layer to form a contact region. A spacer is further formed on the on the sidewalls of the emitter and the remaining of the third dielectric layer. Subsequently, using the emitter, the conductive spacer and the spacer as a mask, a portion of the second dielectric layer and a portion of the first dielectric layer are removed to expose the base contact region on both sides of the oxide spacer. A silicide layer is then formed on the emitter, the conductive spacer and the base contact region.

The present invention provides another structure of a self-aligned bipolar transistor, wherein the structure comprises at least a substrate serving a collector, a base, an extrinsic base contact region, an emitter, a conductive spacer, a first dielectric layer, a second dielectric layer and a third dielectric layer. The base is disposed on the substrate, and the extrinsic base contact region is positioned on the substrate beside both sides of the base. The emitter is disposed on the base, while the conductive spacer is positioned over the top part of the emitter. The first dielectric layer is disposed on the base. The second dielectric layer is disposed on the first dielectric layer, while the third dielectric layer is located over the emitter sidewall and between the conductive spacer and the second dielectric layer. Furthermore, the edges of the third dielectric layer are aligned with the edges of the base.

In view of the above fabrication process, the present invention is characterized by having the emitter and the base of a bipolar transistor formed by a self-aligned method. Thus, wider process windows are provided, and the space between the emitter and the base on the epitaxial layer can be effectively controlled by means of the self-aligned fabrication method.

In accordance with the present invention, in the fabrication process of forming the emitter and the base, the photolithography process is only employed forming the emitter opening. As compared with the conventional method, the present invention is capable of reducing at least one to two photolithography process steps. As a result, the process time and expenses are effectively reduced.

Additionally, the bipolar transistor of the present invention is compatible with the conventionally complementary metal oxide semiconductor device to form a bipolar transistor-complementary metal oxide semiconductor device (bipolar CMOS, BiCMOS). Based on the similar concept, the present invention is applicable for any kind of substrate, such as, gallium arsenide (GaAs), silicon (Si), silicon germanium (SiGe), indium phosphide (InP) and the relative semiconductor materials.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF EMBODIMENTS

First Aspect

FIGS. 2A to 2H are cross-sectional views illustrating a fabricating process for a bipolar transistor according to the present invention.

Figure 2A:
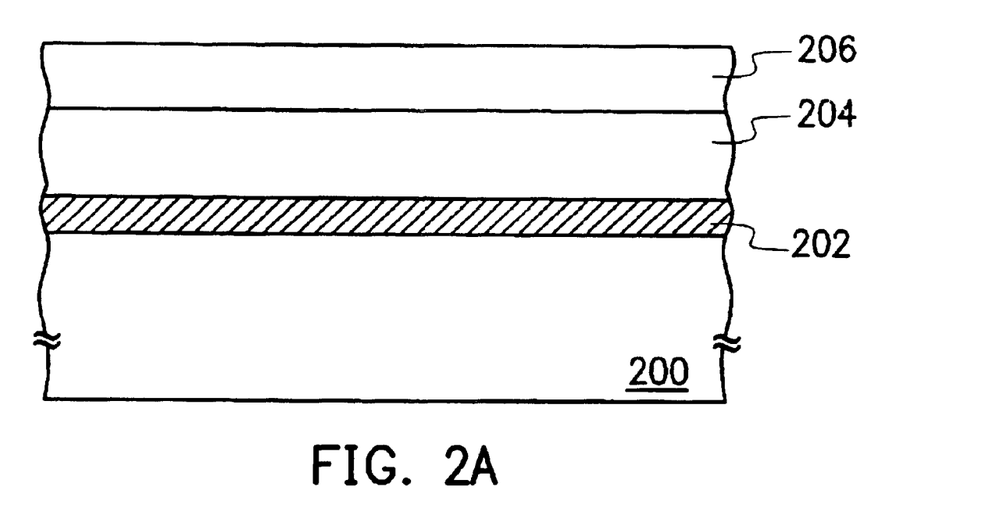
FIGS. 2A to 2H are cross-sectional views showing the fabrication process for a self-aligned bipolar transistor according to the present invention.

As shown in FIG. 2A, a silicon substrate 200 serving as a collector is provided. An epitaxial layer 202, for example, a silicon germanium layer, is formed over the substrate 200 to be a base layer. A first dielectric layer 204 and a second dielectric layer 206 are sequentially formed on the epitaxial base layer 202. The eptiaxial layer 202 is formed by chemical vapor deposition or molecular beam epitaxy, etc. The dielectric layers 204 and 206 are selected to have high etch selectivity and are formed with, for example, silicon nitride, silicon oxide, silicon oxynitride or silicon carbide, by, for example, chemical vapor deposition.

Figure 2B:
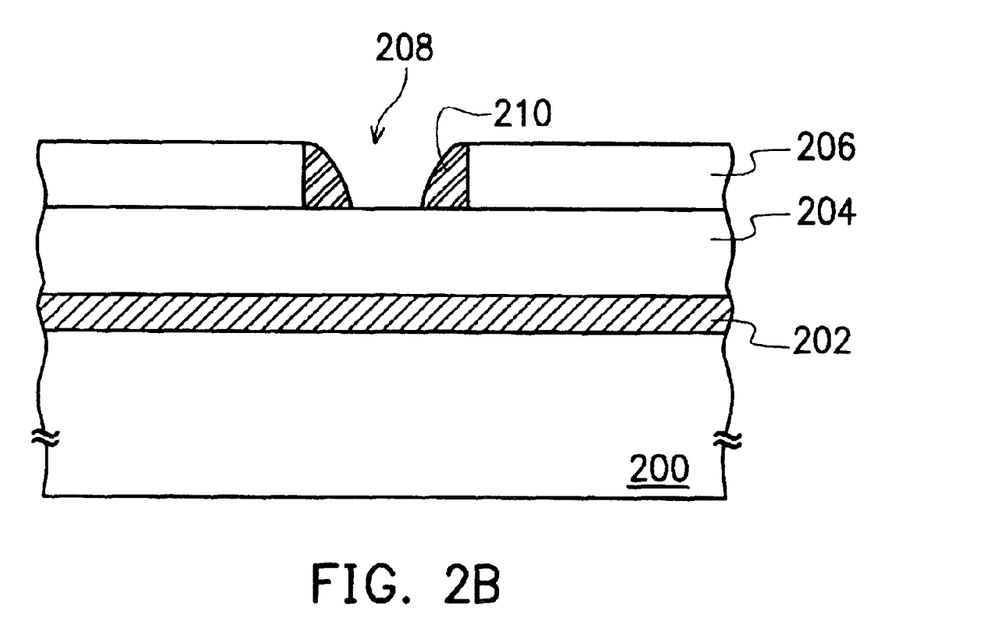

As shown in FIG. 2B, an opening 208 is then formed over the second dielectric layer 206 by a lithography and etch process. The bottom of the opening 208 exposes the first dielectric layer 204. The method of forming the opening 208 is, for example, by forming a patterned mask layer (not shown) over the dielectric layer 206 to define the opening, removing by etching the second dielectric layer 206 to form the opening 208 that exposes the surface of the first dielectric layer 204, and then removing the mask layer. A conductive spacer 210 is formed over the two side walls of the opening 208. The material of the conductive spacer 210 is, for example, polysilicon, and the conductive spacer 210 is by, for example, covering the second dielectric layer 206 and the opening 208 with a conductive layer (not shown), followed by etching back the conductive layer outside the opening 208. The conductive layer is formed, for example, by chemical vapor deposition.

Figure 2C:
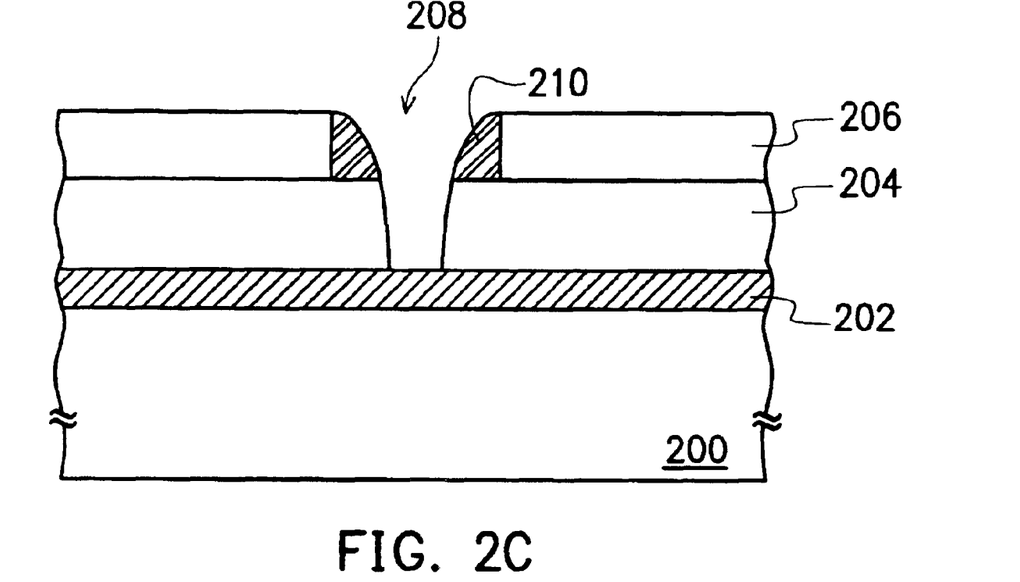

Referring to FIG. 2C, using the second dielectric layer 206 and the conductive spacer 210 as a mask, the dielectric layer 204 in the opening 208 is removed to expose a surface of the epitaxial layer 202, wherein removing the dielectric layer 204 includes anisotropic plasma etching and wet etching.

Due to the fact that the etch selectivity between the conductive spacer 210, the second dielectric layer 206 and the first dielectric layer 204 is high, the second dielectric layer 206 and the conductive spacer 210 can thus use as a mask.

Figure 2D:
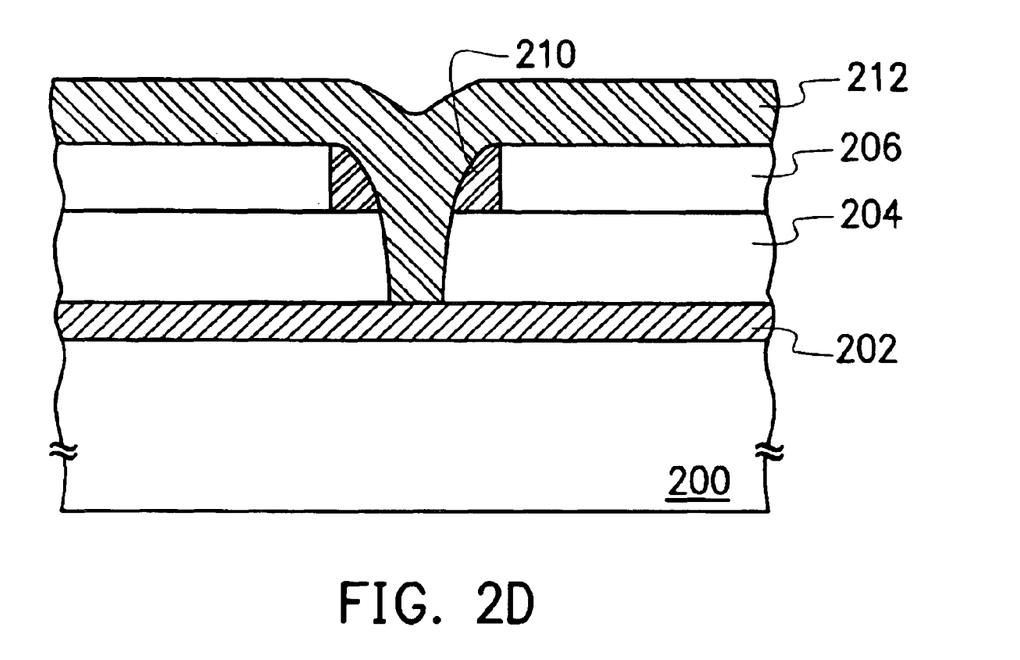

Thereafter, as shown in FIG. 2D, the substrate 200 is covered with a conductive layer 212, wherein the conductive layer 212 is, for example, polysilicon, formed by, for example, chemical vapor deposition.

Figure 2E:
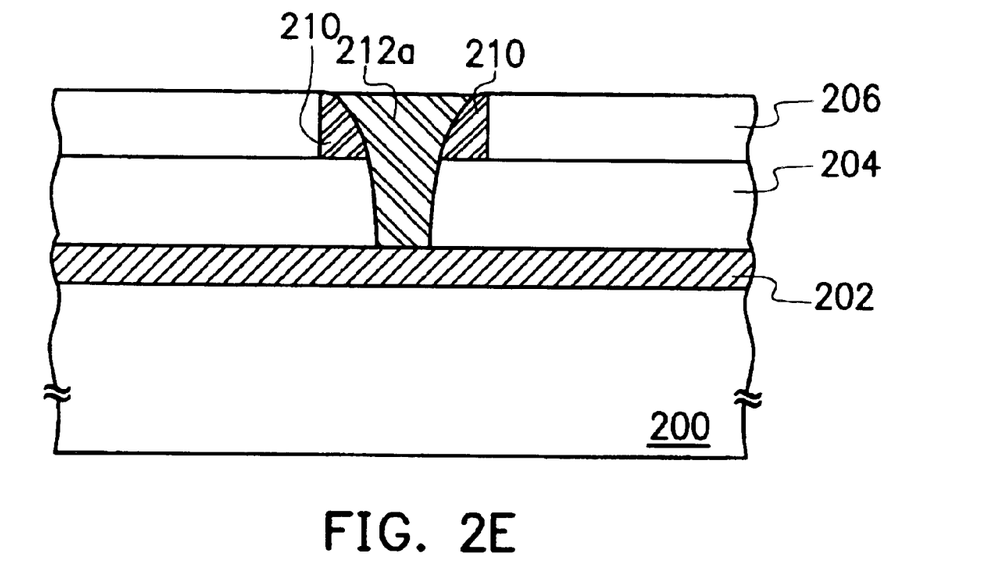

Referring to FIG. 2E, using the second dielectric layer 206 as an etch stop layer, a portion of the conductive layer 212 is removed by etching back or chemical mechanical polishing (CMP) until the surface of the second dielectric layer 206 is exposed. The remaining conductive layer 212 then becomes the emitter 212a of the bipolar transistor.

Figure 2F:
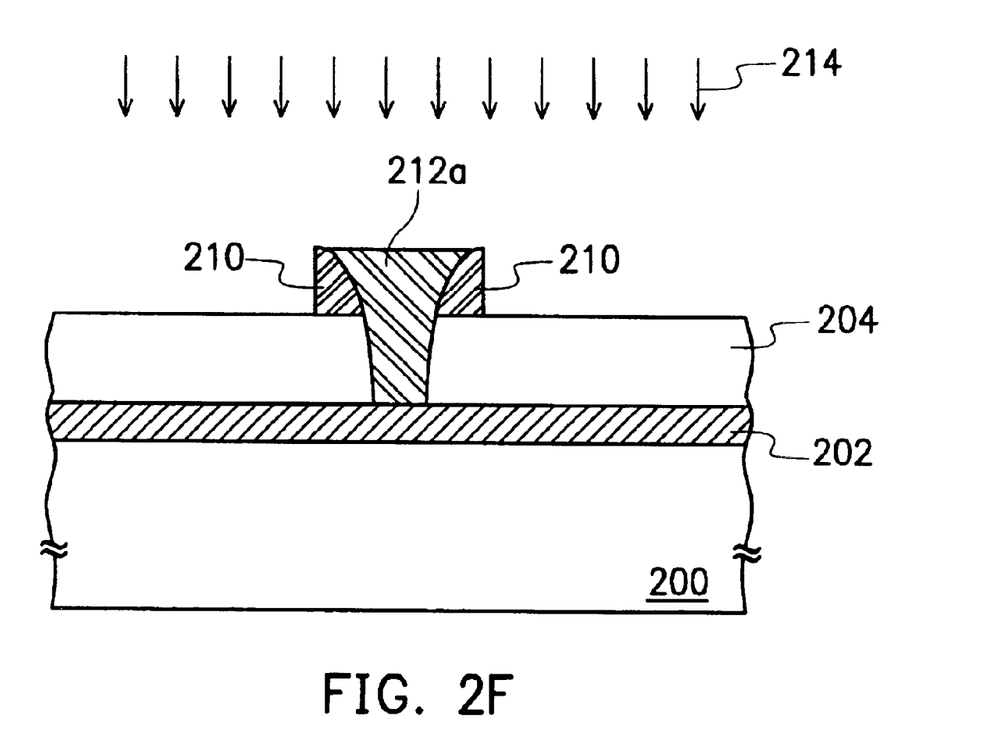

Referring to FIG. 2F, the second dielectric layer 206 is then completely removed, wherein the method of removing the dielectric layer 206 is by a dry or wet etching technique. A first type doping 214 is performed to reduce the resistivity of the emitter 212a.

Figure 2G:
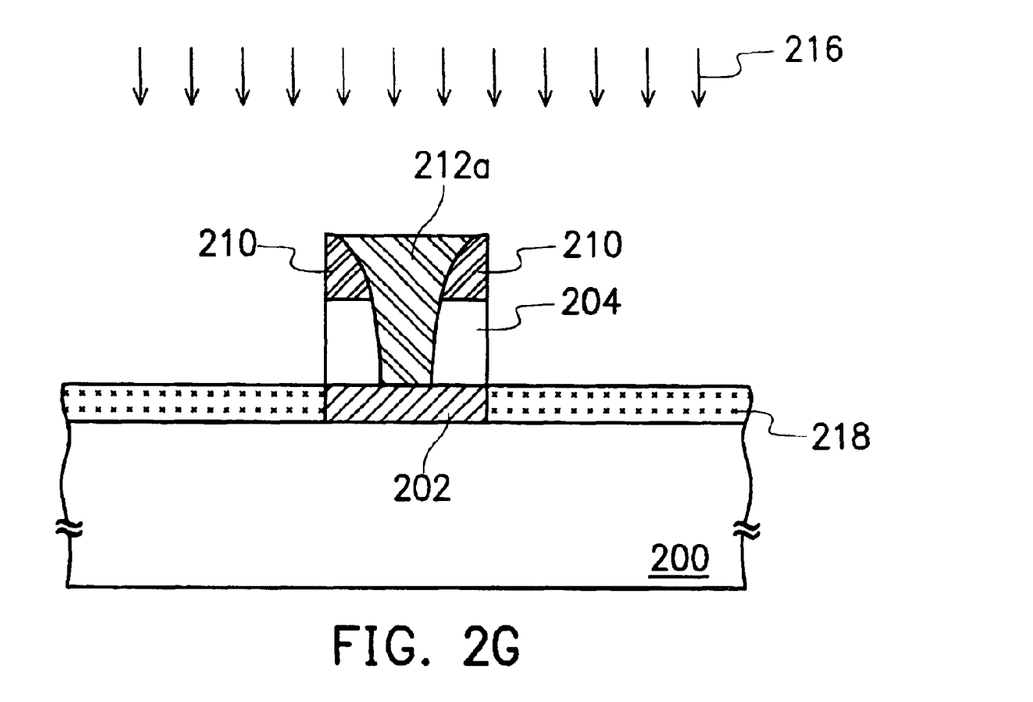

As shown in FIG. 2G, the emitter 212a and the conductive spacer 210 are used as a mask, a portion of the first dielectric layer 204 is removed by anisotropic etching to expose the surface of the epitaxial layer 202. A second type doping 216 is then performed on the epitaxial layer 202 to form an extrinsic base contact region 218 in the epitaxial layer 202, wherein the dopant type for the second type doping is different from that of the first type doping. Further, subsequent to the first and the second doping processes, an annealing process, such as, rapid thermal annealing, may perform to activate the dopants and to eliminate the dopant defects.

Figure 2H:
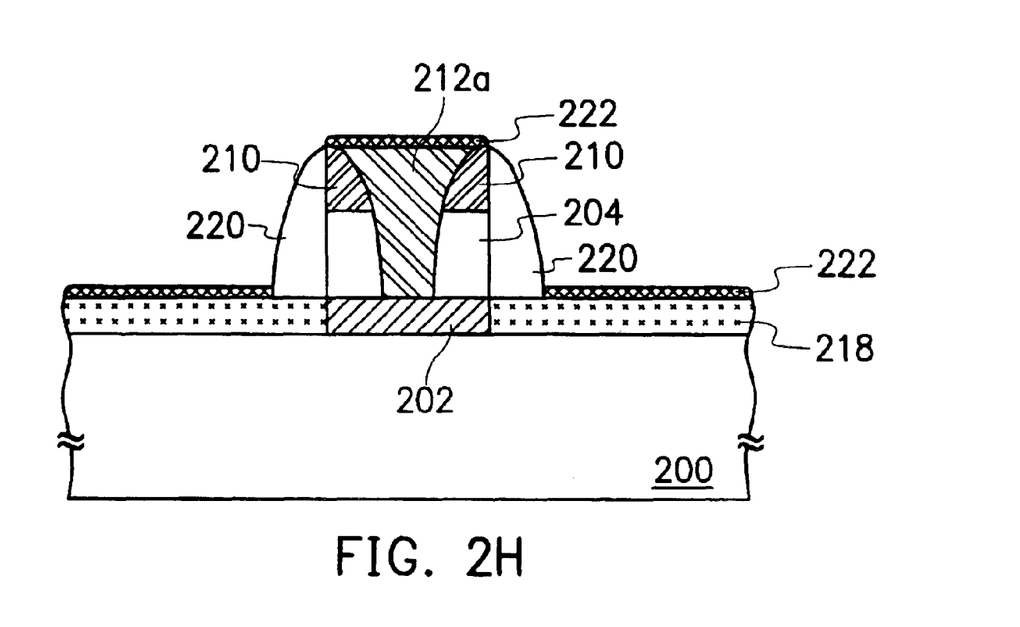

Continuing to FIG. 2H, a dielectric spacer 220 is formed on the sidewalls of the conductive spacer 210 and the remaining first dielectric layer 204. The spacer 220 comprises, for example, silicon oxide, silicon nitride or silicon oxynitride. The dielectric spacer 220 is formed by, for example, covering the substrate 200 with an insulation layer (not shown in Figure), followed by etching back the insulation layer to remove the insulation layer on the emitter 212a and the extrinsic base contact region 218. A salicide layer 222, for example, nickel salicide, cobalt salicide or titanium salicide, is further formed on the emitter 212a and the extrinsic base contact region 218. The salicide layer 222 is formed by, for example, covering the substrate 200 with a metal layer (not shown in Figure), annealing the substrate 200 to induce a reaction between the metal layer and the emitter 212a and the base contact region 218 to form the salicide layer, and removing the unreacted metal layer. The structure of a self-aligned dipolar transistor of the present invention is shown in FIG. 2H.

As shown in FIG. 2H, the self-aligned bipolar transistor includes at least a substrate 200 that serves as a collector, an emitter 212a, a conductive spacer 210, a base 202 and an extrinsic base contact region 218.

The base 202 is positioned on the substrate 200. The extrinsic base contact region 218 is positioned on the substrate 200 beside both sides of the base 202, wherein the extrinsic base contact region 218 is formed with a material same as that for the base 202. The base 202 and the extrinsic base contact region 218 have the same dopant type, and the dopant concentration of the base contact region 218 is higher than that of the base 202.

The emitter 212a is disposed on the base 202. The dopant types of the emitter 212a and the substrate 200 that serves as a collector are the same, but are different from the dopant types of the base and the extrinsic base contact region. In the first aspect of the present invention, the emitter 212a and the substrate 200 have, for example, the N-type dopants, while the base 210 and the extrinsic base contact region 218 have, for example, the P-type dopants.

The conductive spacer 210 is disposed over the top part of the sidewall of the emitter 212a. In this aspect of the invention, the conductive spacer 210 is formed with a polysilicon type of conductive material. However, it should be appreciated that the teaching of the present invention is not limited to doped polysilicon. Other conductive materials, such as, doped gallium arsenide, doped indium phosphide, tungsten silicide, tungsten, titanium or titanium nitride may also be used. The dopant type of the conductive spacer is same as that of the emitter 212a.

Further, the first dielectric layer 204 is also be disposed over the sidewall of the emitter 212a between the conductive spacer 210 and the base 202, wherein the first dielectric layer 204 includes a silicon oxide layer. Additionally, the dielectric spacer 220 is disposed on the sidewalls of the conductive spacer 210 and the remaining first dielectric layer 204. The salicide layer 222 is disposed on the emitter 212a and the extrinsic base contact region 218.

In the first aspect of the present invention, the substrate 200 is a silicon substrate. However, the substrate is not limited to silicon. The substrate of the present invention can be silicon germanium (SiGe), gallium arsenide (GaAs) and indium phosphide (InP) or any kind of semiconductor material. The epitaxy base layer 212 is SiGe in this aspect of the present invention. However, the base layer 212 can also be silicon germanium, silicon, gallium arsenide and indium phosphide, an alloy of aluminum-gallium arsenide ($A_xGa_{1-x}As$, $x \leq 1$) and an alloy of indium-gallium arsenide ($In_xGa_{1-x}As$, $x \leq 1$), or any kind of hereojunction epitaxy film. Further, in this aspect of the present invention, the dielectric layer 204 is silicon oxide and the dielectric layer 206 is silicon nitride. However, the dielectric layers 204, 206 are not limited to silicon oxide and silicon nitride, respectively. Materials with high etch selectivity can be used. For example, the dielectric layer 204 may form with undoped silicon glass, borophosphosilicate glass, phosphosilicate glass, silicon rich oxide or fluorinated silicon glass, while the dielectric layer 206 may form with silicon oxynitride or silicon carbide.

In the first aspect of the present invention, the self-aligned bipolar transistor can a npn type or a pnp type.

Furthermore, the self-aligned bipolar transistor of the present invention is applicable to combine with a CMOS transistor on the same wafer to provide a BICOMS transistor process. In other words, a self-aligned bipolar transistor of the present invention and a P-type MOS or an N-type MOS can concurrently formed on a same wafer.

Second Aspect

FIGS. 3A to 3I are cross-sectional views showing the processing flow in forming a self-aligned bipolar transistor according to the present invention.

Figure 3A:
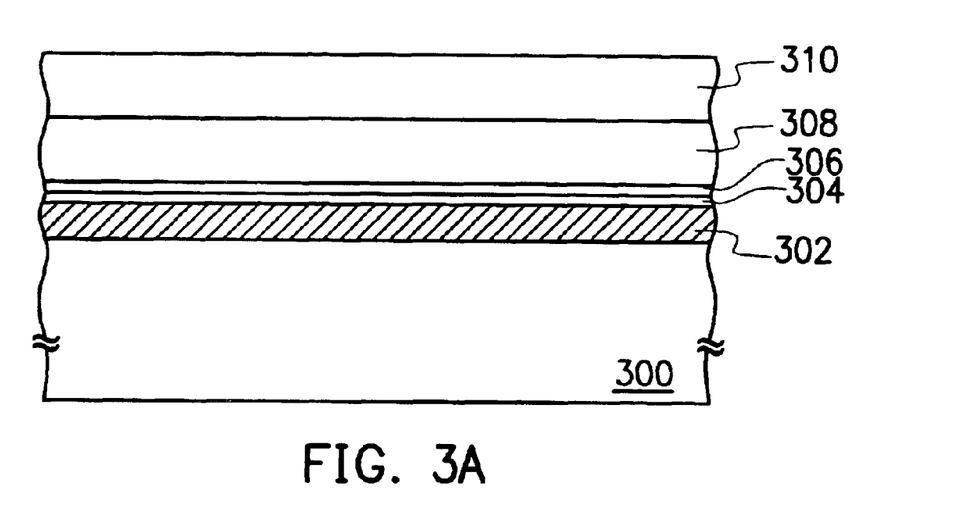
FIGS. 3A to 3I are cross-sectional views showing another option of the fabrication process with an etch stop layer for a self-aligned bipolar transistor according to the present invention.

Referring to FIG. 3A, a silicon substrate 300, which serves as a collector is provided. A silicon germanium epitaxial layer 302 is formed on the substrate 300 as a base layer. The epitaxial layer 302 is formed by chemical vapor deposition or molecular beam epitaxy, etc. A first dielectric layer 304, a second dielectric layer 306, a third dielectric layer 308, a fourth dielectric layer 310 are sequentially formed on the epitaxial base layer 302. The first dielectric layer, the second dielectric layer, the third dielectric layer and the fourth dielectric layer are selected to have high etch selectivity and are formed with, for example, silicon oxide ($SiO_2$), silicon nitride ($SiN_x$), silicon oxynitride ($SiO_xN_y$) by, for example, chemical vapor deposition. The first dielectric layer and the second dielectric layer are about 100 to 500 angstroms thick, while the third dielectric layer and the fourth dielectric layer are about 1000 to 3000 angstroms thick.

In the second aspect of the present invention, the dielectric layer 304 and the dielectric layer 306 are formed to protect the epitaxial layer 302. Moreover, they can also serve as an etch stop layer to accurately control the subsequent etching process.

Figure 3B:
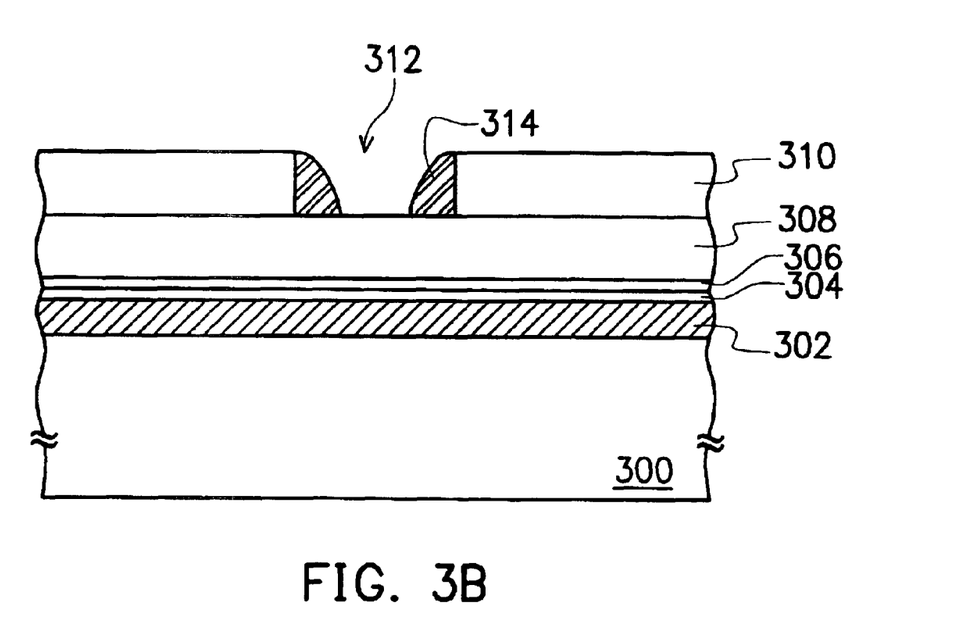

Referring to FIG. 3B, an opening 312 is then formed in the fourth dielectric layer 310 by a lithograph and etch process, wherein the opening 312 exposes the third dielectric layer 308 at the bottom of the opening 312. The method of forming the opening 312 includes forming a patterned mask layer (not shown in Figure) on the fourth dielectric layer 310, and etching the fourth dielectric layer 310 that is not covered by the mask layer until the surface of the third dielectric layer 308 is exposed using the mask layer as a mask. Subsequently, the mask layer is removed. A conductive spacer 314 is then formed over the sidewalls of the opening 312. The conductive spacer 314 is, for example, polysilicon, and the conductive spacer 314 is formed by, for example, covering the dielectric layer 310 and the opening 312 with a conductive layer (not shown in Figure), followed by etching back to remove the conductive layer outside the opening 312. The conductive layer is formed by, for example, chemical vapor deposition.

Figure 3C:
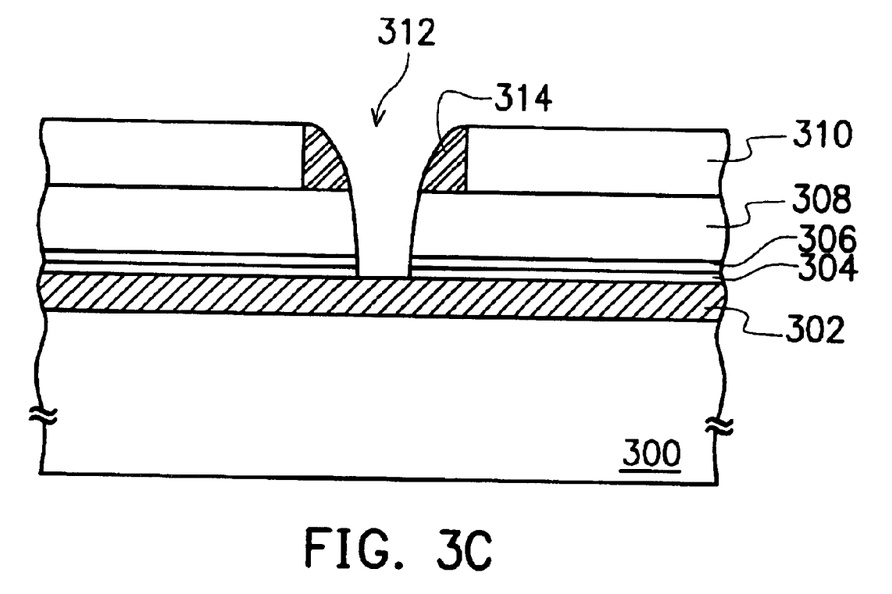

Referring to FIG. 3C, using the fourth dielectric layer 310 and the conductive spacer 314 as a mask, the third dielectric layer 308 and the second dielectric layer 306 in the opening 312 are removed to expose the surface of the first dielectric layer 304, wherein removing the third dielectric layer 308 and the second dielectric layer 306 is by, for example, anisotropic plasma etching or wet etching. After this, the dielectric layer 304 in the opening 312 is removed to expose the surface of the epitaxial layer 302, wherein the first dielectric layer 304 is removed by wet etching, to avoid surface damage of the epitaxial layer 302.

Since in this process step, the fourth dielectric layer 310 and the conductive spacer 314 can use as a mask, forming the opening 312 that is eventually being used as the contact opening between the emitter and the silicon germanium epitaxial layer 302 is thus a self-aligned process.

Since the immersion wet etching technique has a high etch selectivity for the first dielectric layer 304 to the epitaxial layer 302, the dielectric layer 304 can be removed by the immersion wet etching technique. The epitaxial layer 302 is prevented from being damaged and silicon loss is obviated.

Figure 3D:
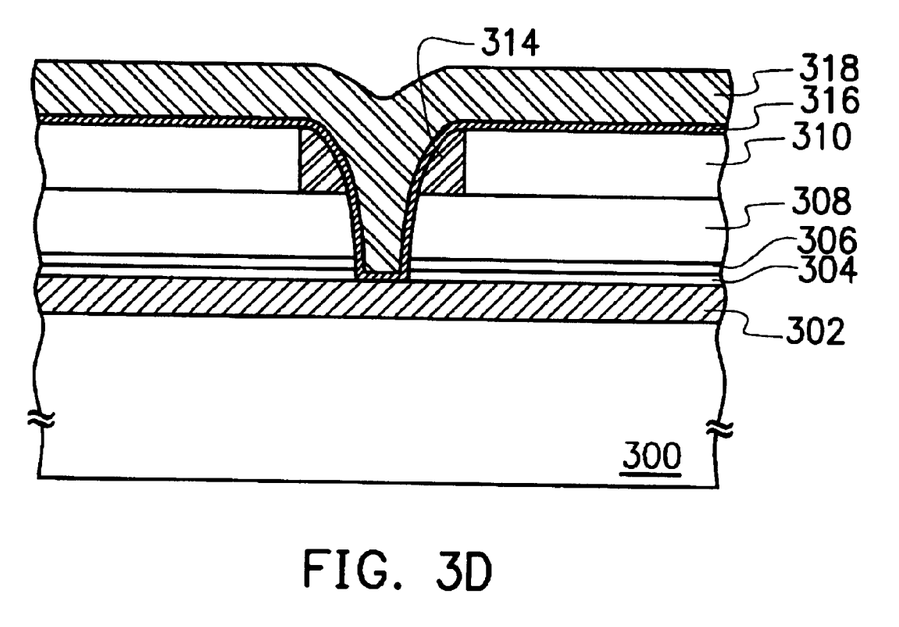

Thereafter, referring to FIG. 3D, the substrate 300 is covered by a conformal conductive layer 316, followed by doping the conductive layer 316, wherein the conductive layer 316 is polysilicon and the dopant is, for example, an N-type dopant, such as, arsenic. The conductive layer 316 is then covered by a conductive layer 318, wherein the conductive layer 318 is, for example, polysilicon.

Before forming the conductive layer 318, the conformal conductive layer 316 is formed and doped to ensure a homogeneous distribution of the dopant at the bottom of the subsequently formed emitter.

Figure 3E:
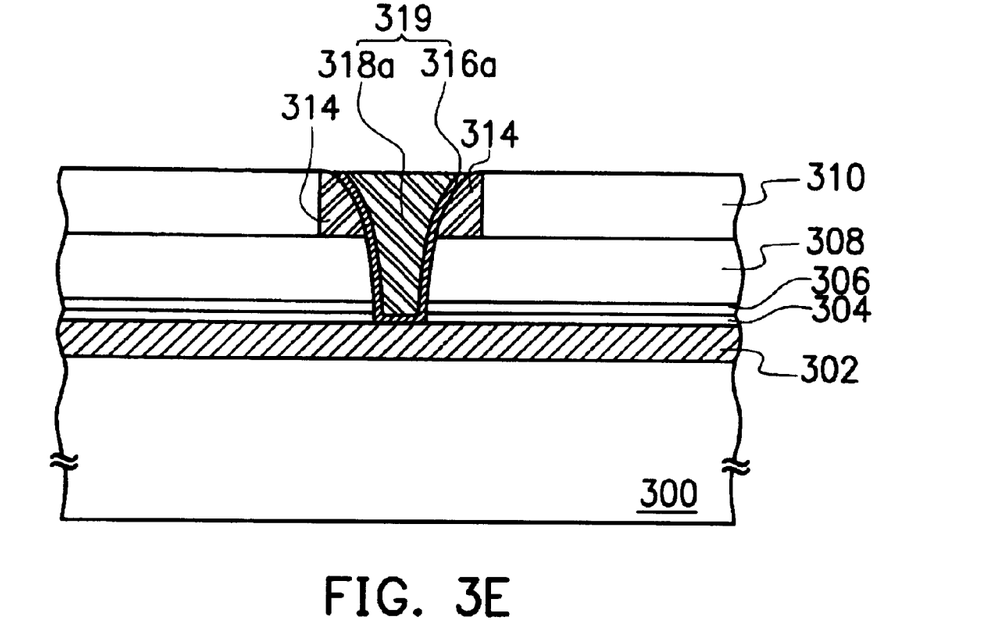

Thereafter, as shown in FIG. 3E, using the fourth dielectric layer 310 as an etch stop layer, portions of the conductive layer 318 and the conductive layer 316 are removed by etching back or CMP until the surface of the fourth dielectric layer 310 is exposed. The remaining conductive layer 318a and the conductive layer 316a are combined to form the emitter 319 of the bipolar transistor.

Figure 3F:
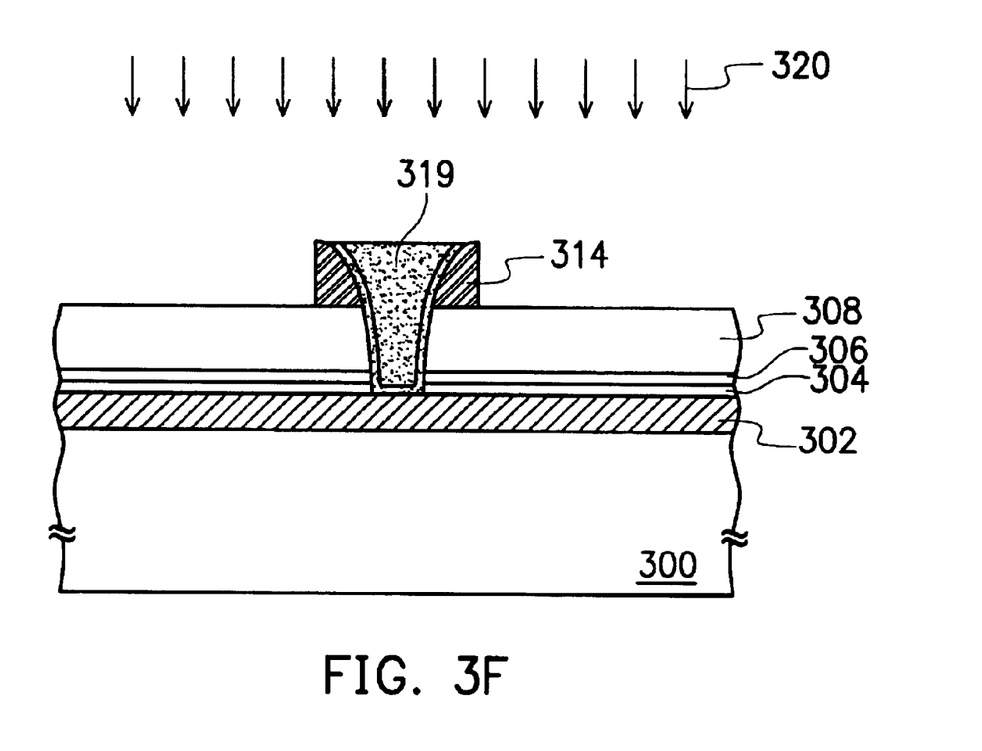

Referring to FIG. 3F, the fourth dielectric layer 310 is then completely removed, wherein removing the fourth dielectric layer 310 by dry or wet etching process. After this, a first type doping 320, for example, an ion implantation process, is conducted to reduce the resistivity of the emitter 319.

Figure 3G:
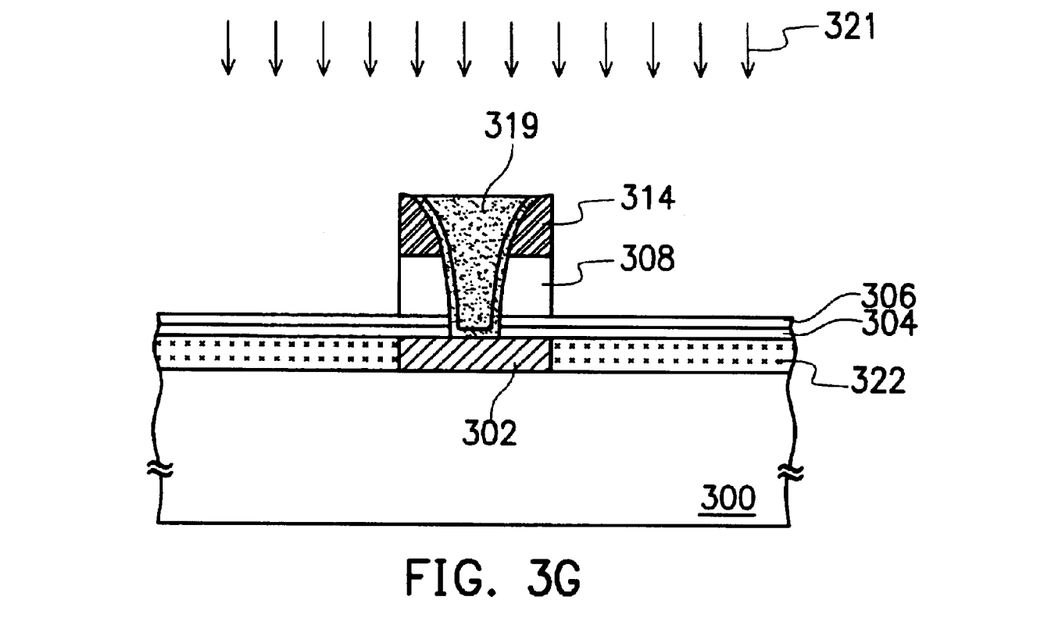

Continuing to FIG. 3G, using the emitter 319 and the conductive spacer 314 as a mask, a part of the third dielectric layer 308 is removed anisotropic etching and stopped on the second dielectric layer 306 to expose the surface of the second dielectric layer 306. Then, using the emitter 319 and the conductive spacer 314 as a mask, a second type doping 321 is conducted on the epitaxial layer 302 to form an extrinsic base contact region 322 on the epitaxial layer 302, wherein the dopant type for the second doping process 321 is different from that for the first type doping process 320.

Figure 3H:
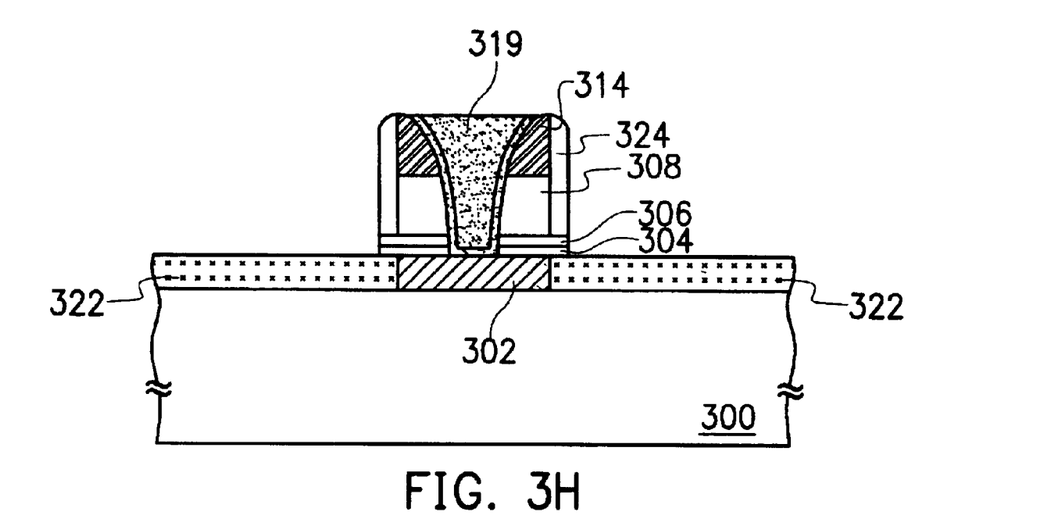

Referring to FIG. 3H, a dielectric spacer 324 is formed on the sidewalls of the conductive spacer 314 and the remaining third dielectric layer 308, wherein the spacer 324 comprises, for example, silicon oxide. Forming the dielectric spacer 324 includes covering the substrate 300 with an insulation layer (not shown in Figure), followed by etching back the insulation layer to remove the insulation layer on the emitter 319, the conductive spacer 314 and the extrinsic base contact region 322 to form the dielectric spacer 324. Thereafter, using the emitter 319, the conductive spacer 314 and the dielectric spacer 324 as a mask, the second dielectric layer 306 is etched and stopped on the first dielectric layer 304, exposing the surface of the first dielectric layer 304, wherein removing the second dielectric layer 306 is by, for example, anisotropic etching. The first dielectric layer 304 is further removed until the surface of the extrinsic base contact region 322 is exposed, wherein removing the dielectric layer 304 includes using the immersion wet etching technique in a buffer oxide etchant.

In the process steps 3F to 3H, the conductive spacer and the fourth dielectric layer have a high etch selectivity to the third, the second and the first dielectric layers, the conductive spacer and the fourth dielectric layer can serve as a mask. Further, the third and the fourth dielectric layers have a high etch selectivity, and the first and the second dielectric layers also have a high etch selectivity.

Figure 3I:
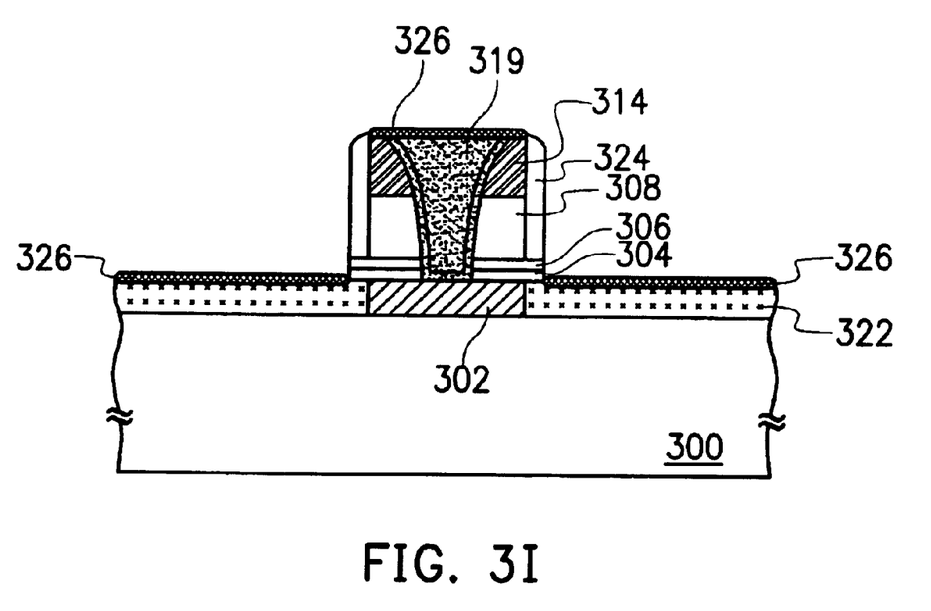

Referring to FIG. 3I, a salicide layer 326 is formed on the emitter 320 and the base contact region 322, wherein the salicide layer 326 comprises, for example, nickle salicide, cobalt salicide or titanium salicide. The salicide layer 326 is formed by, for example, covering the substrate with a metal layer (not shown in Figure), annealing the substrate 300 to induce a reaction between the emitter 319, the extrinsic base contact region 322 and the metal layer to form the salicide layer 326, and removing the unreacted metal.

The structure of the self-aligned bipolar transistor according to the second aspect of the present invention is illustrated in FIG. 3I.

As shown in FIG. 3I, the self-aligned bipolar transistor includes at least a substrate 300 that serves a collector, an emitter 319, a conductive spacer 314, a base 302 and an extrinsic base contact region 322.

The base 302 is positioned on the substrate 300. The base contact region 322 is disposed on the substrate 300 beside the sides of the base 302 same as that for the base 302. The base 302 and the extrinsic base contact region 322 are doped with a same type of dopant, and the dopant concentration is higher in the extrinsic base contact region 322 than that in the base 302.

The emitter 319 is disposed on the base 302. The dopant types of the emitter 319 and the substrate 300 that serves as a collector are the same, but are different from the dopant types of the base 302 and the extrinsic base contact region 322. In this aspect of the present invention, the emitter 319 and the substrate 300 both have an N-type dopant, while the base 302 and the base contact region 322 have a P-type dopant.

The conductive spacer 314 is disposed over the top part of the sidewall of the emitter 319. Although in this aspect of the invention, the conductive spacer 314 is formed with a polysilicon type of conductive material, it should be appreciated that the teaching of the present invention is not limited to doped polysilicon. Other conductive materials, such as, doped gallium arsenide, doped indium phosphide, tungsten silicide, tungsten, titanium or titanium nitride may also be used. The dopant type of the conductive spacer 314 is same as that of the emitter 319.

The above structure further comprises a first dielectric layer 304 being disposed over the base 302 beside both sides of the emitter 319. The first dielectric layer 304 is extended to a part of the base contact region 322. The dielectric layer 304 comprises, for example, silicon oxide.

The second dielectric layer 306 is disposed on the dielectric layer 304. The dielectric layer 306 comprises, for example, silicon nitride, silicon oxynitride or silicon carbide.

The third dielectric layer 308 is disposed over the sidewall of the emitter 319 between the conductive spacer 314 and the second dielectric layer 306. The third dielectric layer 308 is, for example, silicon oxide, wherein the edge of the dielectric layer is approximately aligned with the edge of the base 302.

The dielectric spacer 324 is disposed over the sidewalls of the conductive spacer 314 and the third dielectric layer 308. The dielectric spacer 324 is, for example, silicon oxide, wherein the edge of the spacer 324 is approximately aligned with the edge of the second dielectric layer 306.

The metallic layer 326 is positioned on the emitter 319, the conductive spacer 314, the base contact region 322, wherein the metallic layer includes nickel silicide, cobalt silicide or titanium silicide.

In this aspect of the present invention, the dielectric layer 304 comprises silicon oxide, the dielectric layer 306 comprises silicon nitride, the dielectric layer 308 comprises silicon oxide, and the dielectric layer 310 comprises silicon nitride. However, the dielectric layers 304, 306, 308, 310 are not limited to these materials. Any materials that can provide these dielectric layers with high etching selectivity are acceptable. For example, the dielectric layers 304, 308 may form with undoped silicon glass, borophosphosilicate glass, phosphosilicate glass, silicon rich oxide or fluorinated silicon glass, while the dielectric layer 306, 310 may form with silicon oxynitride or silicon carbide.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a bipolar transistor, comprising the steps of:

providing a substrate having an epitaxial layer already formed thereon, wherein the epitaxial layer serves as a base;

forming sequentially a first dielectric layer, a second dielectric layer on the epitaxial layer;

forming an opening in the second dielectric layer;

forming a conductive spacer on a sidewall of the opening;

removing the first dielectric layer within the opening using the second dielectric layer and the conductive spacer as a mask;

forming a conductive layer in the opening;

removing the conductive layer outside the opening to form an emitter;

removing the second dielectric layer and a portion of the first dielectric layer to form a self-aligned bipolar transistor using the emitter and the conductive spacer as a mask; and performing a doping step on the epitaxial layer to form an extrinsic epitaxial base contact area.

2. The method of claim 1, wherein the substrate is formed with a material selected from the group consisting of silicon germanium, silicon, gallium arsenide and indium phosphide.

3. The method of claim 1, wherein the epitaxial layer comprises a material selected from the group consisting of silicon germanium, silicon, gallium arsenide and indium phosphide, an alloy of aluminum-gallium arsenide ($Al_xGa_{1-x}As$, $x \leq 1$) and an alloy of indium-gallium arsenide ($In_xGa_{1-x}As$, $x \leq 1$).

4. The method of claim 1, wherein the conductive spacer is doped polysilicon doped gallium arsenide, doped indium phosphid, tungsten silicide, tungsten, titanium or titanium nitride.

5. The method of claim 1, wherein the conductive spacer and the conductive layer have a high etch selectivity to the first dielectric layer and the second dielectric layer.

6. The method of claim 1, wherein the first dielectric layer and the second dielectric layer have a high etch selectivity.

7. The method of claim 6, wherein the first dielectric layer is formed with a material selected from the group consisting of undoped silicon glass, borophosphosilicate glass, phosphosilicate glass, silicon rich oxide and fluorinated silicon glass.

8. The method of claim 6, wherein the second dielectric layer is formed with a material selected from the group consisting of silicon nitride, oxynitride and silicon carbide.

9. The method of claim 1, wherein the conductive layer is formed with polysilicon, gallium arsenide, or indium phosphide.

10. The method of claim 1, wherein forming the conductive layer into the opening comprises:
   depositing a conductive layer and filling the opening; and
   removing a part of the conductive layer outside the opening.

11. The method of claim 10, wherein removing the part of the conductive layer outside the opening comprises performing chemical mechanical polishing or etching back.

12. The method of claim 1 further comprising a doping process on the emitter to reduce a resistivity of the emitter.

13. The method of claim 1, wherein a dopant type of the base is different from a dopant type of the emitter and the collector.

14. The method of claim 1 further comprising forming a dielectric spacer around the emitter.

15. The method of claim 1 further comprising forming a self-aligned silicide on both the emitter and the extrinsic base contact area.

16. The method of claim 1 further comprising a rapid thermal annealing process to activate dopants and eliminate a doping defect.

17. A fabrication method for a self-aligned bipolar transistor, comprising:
   providing a substrate having an epitaxial layer already formed thereon as a base;
   forming sequentially a first dielectric layer, a second dielectric layer, a third dielectric layer and a fourth dielectric layer on the substrate;
   forming an opening in the fourth dielectric layer, forming a conductive spacer on a sidewall of the opening;
   removing the third dielectric layer, the second dielectric layer and the first dielectric layer within the opening using the fourth dielectric layer and the conductive spacer as a mask;
   forming a conductive layer on the fourth dielectric layer and to fill the opening;
   removing the conductive layer outside the opening to form an emitter; and
   fully removing the first, the second, the third and the fourth dielectric layers to form a self-aligned bipolar transistor using the emitter and the conductive spacer as a mask.

18. The method of claim 17 further comprising performing a first doping on the emitter.

19. The method of claim 17 further comprising performing a second doping on the epitaxial layer to form an extrinsic base contact area.

20. The method of claim 17, wherein the substrate is formed with a material selected from the group consisting of silicon germanium, silicon, gallium arsenide and indium phosphide.

21. The method of claim 17, wherein the epitaxial layer is formed with a material selected from the group consisting of silicon germanium, silicon, gallium arsenide and indium phosphide, an alloy of aluminum-gallium arsenide ($Al_xGa_{1-x}As$, $x \leq 1$) and an alloy of indium-gallium arsenide ($In_xGa_{1-x}As$, $x \leq 1$).

22. The method of claim 17, wherein the conductive spacer is formed with a material consisting of polysilicon, doped gallium arsenide, doped indium phosphide, tungsten silicide, tungsten, titanium and titanium nitride.

23. The method of claim 17, wherein the conductive spacer has a high etch selectivity to the first dielectric layer, the second dielectric layer, the third dielectric layer and the fourth dielectric layer.

24. The method of claim 17, wherein the first dielectric layer and the second dielectric layer have a high etch selectivity.

25. The method of claim 17, wherein the second dielectric layer and the third dielectric layer have a high etch selectivity.

26. The method of claim 17, wherein the third dielectric layer and the fourth dielectric layer have a high etch selectivity.

27. The method of claim 17, wherein the first dielectric layer and the third dielectric layer are formed with materials selected from the group consisting of undoped silicon glass, borophosphosilicate glass, phosphosilicate glass, silicon rich oxide and fluorinated silicon glass.

28. The method of claim 17, wherein the second dielectric layer and the fourth dielectric layer are formed with materials selected from the group consisting of silicon nitride, silicon oxynitride and silicon carbide.

29. The method of claim 17 further comprising forming a dielectric spacer around the emitter.

30. The method of claim 17 further comprising forming a salicide layer on the emitter and the extrinsic base contact area.

* * * * *